United States Patent [19]

Kalthoff et al.

[11] Patent Number: 4,901,031

[45] Date of Patent: Feb. 13, 1990

[54] COMMON-BASE, SOURCE-DRIVEN DIFFERENTIAL AMPLIFIER

[75] Inventors: Timothy V. Kalthoff; Rodney T. Burt; R. Mark Stitt, II, all of Tucson, Ariz.

[73] Assignee: Burr-Brown Corporation, Tucson, Ariz.

[21] Appl. No.: 298,116

[22] Filed: Jan. 17, 1989

[51] Int. Cl.[4] .............................................. H03F 3/45
[52] U.S. Cl. .................................... 330/253; 330/258; 330/261; 330/300
[58] Field of Search ................. 330/253, 258, 261, 300

[56] References Cited

U.S. PATENT DOCUMENTS

| | | | |
|---|---|---|---|
| 3,644,838 | 2/1972 | Graf | 330/3 |
| 3,873,933 | 3/1975 | Wheatley, Jr. | 330/30 D |
| 4,068,184 | 1/1978 | Ahmed | 330/257 |
| 4,194,166 | 3/1980 | Sakai et al. | 330/257 |
| 4,462,002 | 7/1984 | Schade, Jr. | 330/253 |
| 4,472,648 | 9/1984 | Prentice | 307/571 |
| 4,634,993 | 1/1987 | Koen | 330/253 |

Primary Examiner—James B. Mullins
Attorney, Agent, or Firm—Cahill, Sutton & Thomas

[57] ABSTRACT

A common-base, source-driven differential amplifier achieves both high speed operation and low noise operation by providing an input stage including a pair of source follower JFETs that drive emitters of a pair of NPN input transistors having their bases connected together and to a bias circuit. The collectors of the NPN transistors each are connected to a corresponding load device and to a corresponding input of an output amplifier stage. The bias circuit includes a current source and a pair of diode-connected NPN transistors having their bases and collectors connected to the current source and to the bases of the input transistors. The emitters of the diode-connected NPN transistors are connected to sources of a second pair of source follower JFETs, the gates of which are connected to the input terminals.

17 Claims, 2 Drawing Sheets

COMMON-BASE, SOURCE-DRIVEN DIFFERENTIAL AMPLIFIER

BACKGROUND OF THE INVENTION

This invention relates to monolithic amplifiers having the combination of low noise, low input bias current, and high speed.

The need exists for monolithic operational amplifiers with performance more nearly approaching that of an "ideal" operational amplifier having low noise, low input bias current, and high speed operation. FET (field effect transistor) input devices can provide the needed low bias current, but FETs fabricated using conventional monolithic IC manufacturing processes have relatively low bandwidth. Using prior circuit topologies, it has been possible to construct FET input amplifiers with either low noise or high speed, but not the combination of both. When an input FET is used as a gain stage it is capable of low noise operation, but its speed of operation is greatly limited. When an input FET is used as a voltage follower "in front of" a bipolar transistor gain stage, it is capable of higher speed operation, but also has higher noise. The circuit of the present invention provides a combination of the best low noise and high speed features of both of the prior kinds of FET input amplifiers.

FIG. 1 shows a common prior art amplifier designed to minimize noise and maximize signal-to-noise ratio. In the circuit of FIG. 1, the width-to-length geometry ratio of the P channel input JFETS 1 and 2 is large, typically approximately 80. The current I produced by current source 20 typically is about 400 microamperes.

As known to those skilled in the art, increasing the Gm of a JFET (Junction Field Effect Transistor) results in improved noise performance. For a particular manufacturing process and JFET channel length, there are two ways to increase Gm. One is to increase the channel width of the JFET. The other way is to increase the drain-source current. It is often impractical to increase the drain-source current to increase Gm. The theoretical voltage noise produced in JFETs is proportional to 1/SQRT(Gm). Therefore, low noise operation is achieved by making Gm large. Increasing Gm also has the effect of reducing the contribution of other noise sources. For example, if operational amplifier 3 has differential noise on its inputs, the noise imparts a signal noise voltage across resistors 4 and 5, and hence causes signal noise currents to flow through JFETs 1 and 2. As the Gm of the JFETs 1 and 2 increase, the amount of noise signal that has to be compensated by $\Delta V_{IN}$ decreases. ($\Delta V_{IN}$ is equal to $V_{IN}{}^+ - V_{IN}{}^-$.) Therefore, the effect of such noise sources is reduced by increasing Gm.

The large transconductance Gm obtained by use of large JFET channel widths results in low noise levels, but also results in slow speed, because the large channel widths result in large gate-to-drain capacitances $C_{GD}$ between input conductors 16 and 17 and drain conductors 18 and 19, respectively. As a result of "Miller Multiplication", the capacitances $C_{GD}$ are multiplied by the gains of the two "halves" of the differential amplifier, respectively.

As a result of the large $C_{GD}$ capacitance of the low noise JFET and Miller multiplication of that $C_{GD}$ capacitance, the circuit of FIG. 1 is unsuitable for use in applications requiring high bandwidth. The large $C_{GD}$ introduces phase shifts that necessitate use of larger compensation capacitors, which in turn decrease slew rate.

FIG. 2 shows another typical prior art operational amplifier which is designed for high speed. However, this circuit is characterized by a low signal-to-noise ratio. The performance-degrading effect of the of the Miller feedback capacitance $C_{GD}$ of FIG. 1 is avoided in the circuit of FIG. 2 by using source followers 1,22, and 2,23 instead of the inverting stages 1,4 and 2,5 of FIG. 1 because the source followers 1,22 and 2,23 drive a pair of emitter-coupled PNP bipolar transistors 6 and 7 with very low parasitic base-collector capacitances. The circuit of FIG. 2 therefore can have high bandwidth and fast settling, but it suffers from high noise.

The high noise is caused by the addition of noise in resistors 6A and 7A and transistors 6 and 7 to noise in input JFETs 1 and 2. This noise is in addition to noises present in the circuit of FIG. 1. The circuit of FIG. 2 also has high power dissipation due to use of the three current sources 22, 23, and 24.

Use of emitter degeneration resistors 6A and 7A in series with emitters of transistors 6 and 7 is necessary to reduce the gain of the circuit and the size of the compensation capacitor necessary to achieve high speed operation. Such degeneration resistors add a resistive thermal noise to the voltage noise level referred back to the inputs 16 and 17.

Up to now, no one has been able to provide a monolithic integrated circuit operational amplifier or the like having both high speed performance, low noise performance, and very low input bias currents. There remains an unmet need for such an amplifier.

SUMMARY OF THE INVENTION

Accordingly, it is an object of the invention to provide a high speed, low noise amplifier.

It is another object of the invention to provide an operational amplifier or the like which avoids introduction of various noise voltages into the differential signal path thereof.

It is another object of the invention to provide a technique for coupling a pair of input field effect transistors of a differential amplifier to a pair of differentially connected bipolar transistors without introducing noise into the signal path.

Briefly described, and in accordance with one embodiment thereof, the invention provides an amplifier circuit that achieves both high speed operation and low noise operation, in which a bias circuit avoids feeding any noise currents into the differential signal path. A common base bipolar differential stage receives signals from a pair of JFET input devices. The common base bipolar stage receives a bias voltage produced by a bias circuit. The bias circuit is responsive to at least one of the input signals applied to the bases of the FET input devices.

In the described embodiment, an operational amplifier input stage includes a first transistor, a collector of which is connected to a first output terminal, and a second transistor having its base connected to the base of the first transistor and having its collector connected to a second output terminal. First and second load devices are connected, respectively, to the collectors of the first and second transistors. A bias circuit applies a common bias voltage to the bases of the first and second transistors. A first JFET has its source connected to the emitter of the first transistor, its gate connected to a first input terminal, and a second JFET has its source connected to the emitter of the second transistor and its gate connected to a second input terminal. The drains of the first and second JFETS supply current to a negative supply voltage conductor. The bias circuit includes a current source connected between a positive supply voltage and the bases of the first and second transistors. A first diode-connected transistor is connected between a conductor connecting the bases of the first and second transistors and the source of a third JFET, the gate of which is connected to the first input terminal. A second diode-connected transistor is connected between the conductor connecting the bases of the first and second transistors and the source of a fourth JFET, the gate of which is connected to the second input terminal. The drains of the third and fourth JFETs are connected to a negative supply voltage conductor. The circuit supplies high input impedance, high bandwidth, and fast settling times. These benefits are achieved because the described circuit permits connection of the sources of the first and second JFETS directly to the emitters of the first and second transistors, respectively. The circuit provides a high signal-to-noise ratio because large channel width to channel length ratios are provided for the first and second JFETs and because all noise voltage sources associated with the bias circuit ar applied only to the bases of the first and second transistors, and therefore do not appear in the differential signal path between the first and second input terminals and the first and second output terminals.

DETAILED DESCRIPTION OF THE PREFERRED EMBODIMENT

Figure 3:
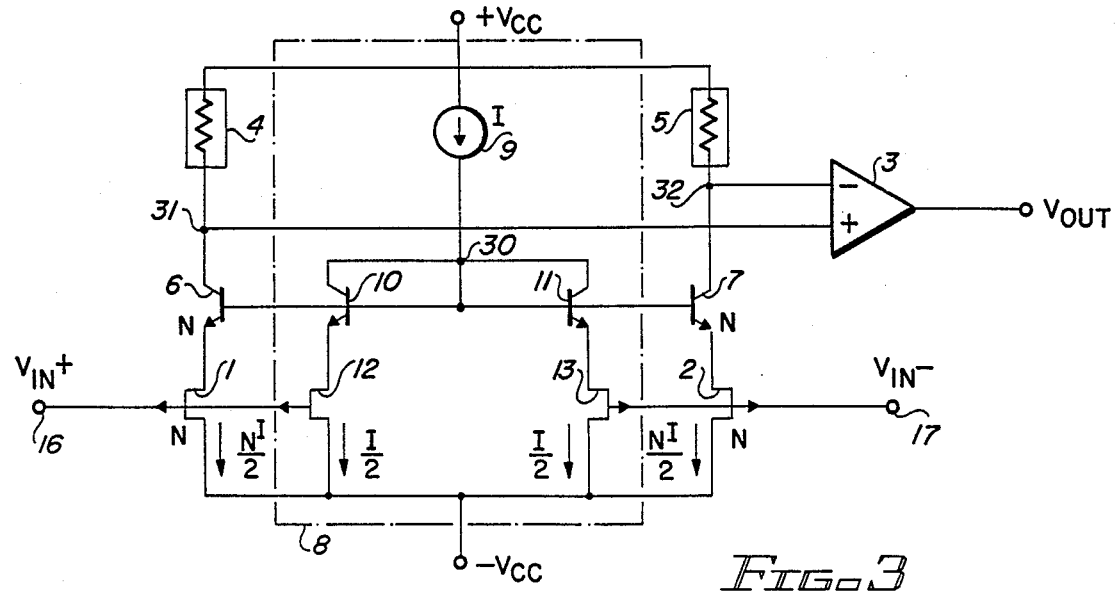
FIG. 3 is a schematic diagram of a simplified embodiment of the present invention.

The circuit shown in FIG. 3 improves upon the previously discussed operational amplifier input stage topologies. The JFET input transistors 1 and 2 share the same currents as the bipolar differential pair of transistors 6 and 7, respectively. Transistors 6 and 7 are connected to provide high amplification. The collector-base capacitances of transistors 6 and 7 are much lower than the gate-drain capacitances would be if the JFET differential pair of FIG. 1 were used. Since the amplification multiplies the effects of the parasitic gate-drain capacitance (as in FIG. 1) or base-collector capacitance (as in FIG. 3), the lower base-collector capacitance results in much greater bandwidth for the circuit of FIG. 3 than for the circuit of FIG. 1. The noise voltages produced in the bipolar transistors 6 and 7 are negligible compared to the noise voltages produced by the JFETs 1 and 2. As will become apparent from the following description, the noise sources produced in the bias circuit included in FIG. 3 are "common mode" in nature, and therefore have no effect on the differential signal.

The structure of the amplifier of FIG. 3 will now be described. The input stage of the amplifier includes input terminals 16 and 17 to which $V_{IN}+$ and $V_{IN}-$ are applied, respectively. The input stage also includes "output" nodes 31 and 32, respectively, which are connected to the non-inverting and inverting inputs, respectively, of a second amplifier stage 3, the output of which produces an output voltage $V_0$.

Figure 5:
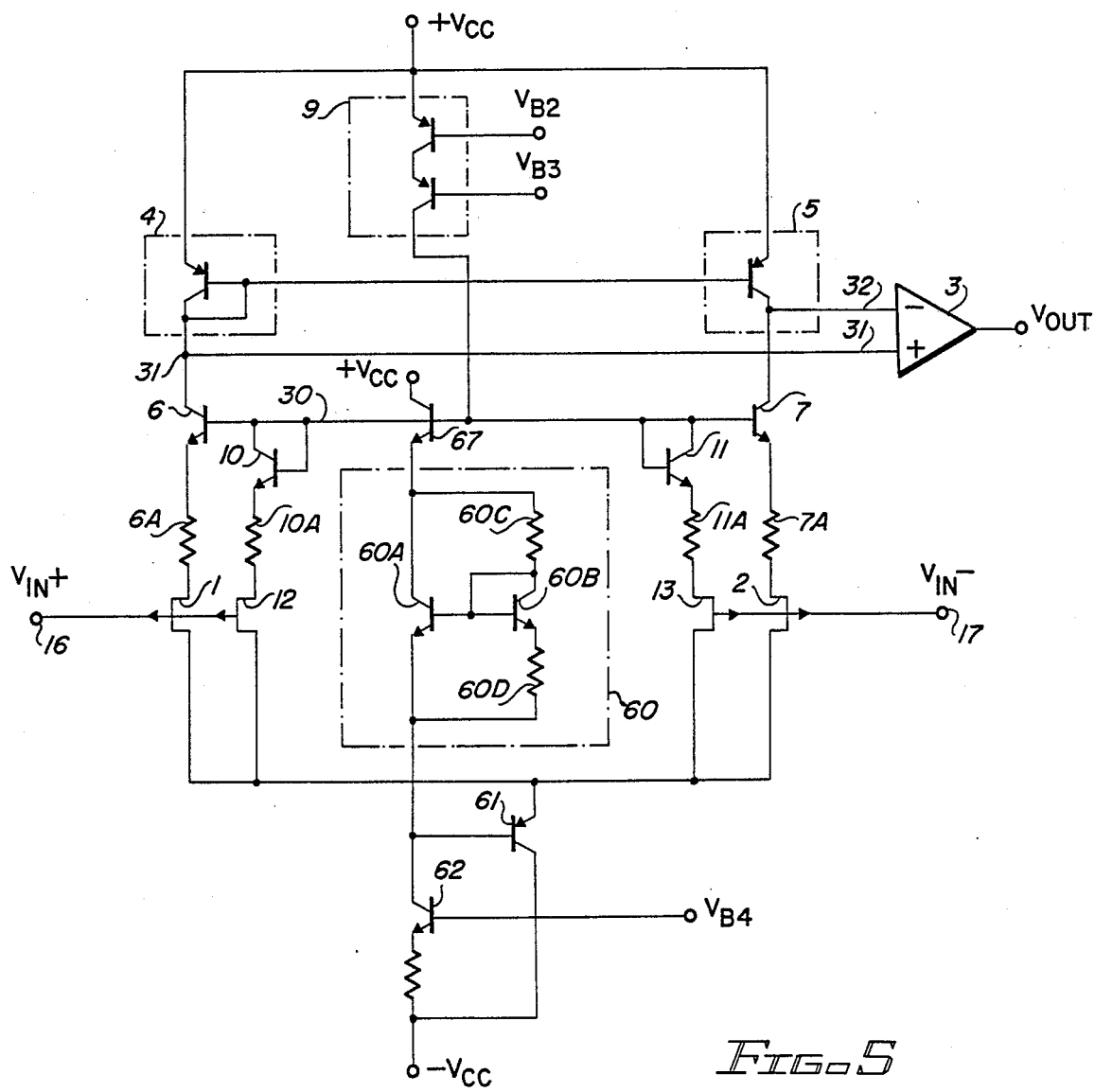
FIG. 5 is a schematic diagram of another embodiment of the invention.

The input stage includes a pair of load devices 4 and 5 connected between $+V_{CC}$, which can be $+15$ volts, and conductors 31 and 32, respectively. Load devices 4 and 5 can be resistors as shown in FIG. 3 or PNP current mirror transistors as shown in FIG. 5. A pair of common-base-connected, differentially connected NPN transistors 6 and 7 have their collectors connected to conductors 31 and 32, respectively. The emitter of transistor 6 is connected to the source of a P channel JFET 1 having its gate connected to conductor 16 and its drain connected to $-V_{CC}$, which can be $-15$ volts. The emitter of transistor 7 is connected to the source of P channel JFET 2, the gate of which is connected to conductor 17 and the drain of which is connected to $-V_{CC}$.

A bias circuit 8 supplies a bias voltage to conductor 30, which is connected to the base electrodes of transistors 6 and 7. Bias circuit 8 includes a current source 9 connected between $+V_{CC}$ and conductor 30 and producing a current I. Bias circuit 8 also includes a diode-connected NPN transistor 10 having its emitter connected to the source of P channel JFET 12 and its base and collector both connected to conductor 30. The gate of JFET 12 is connected to conductor 16 and its drain is connected to $-V_{CC}$. Diode-connected NPN transistor 11 has its emitter connected to the source of P channel JFET 13 and has its base and collector connected to conductor 30. The gate of JFET 13 is connected to conductor 17. The drain of JFET 13 is connected to $-V_{CC}$.

The emitter area of each of transistors 6 and 7 is scaled to the emitter area of transistors 10 and 11 by a factor of N. JFETS 1 and 2 are matched to each other, and have gate width-to-length ratios N times that of JFETS 12 and 13. For example, bipolar transistors 10 and 11 can be minimum sized devices, and JFETs 12 and 13 can have a channel width-to-length ratio of approximately 22. N can have a value of approximately 8, resulting in an acceptably low level of noise generation in JFETs 1 and 2. Consequently, when $V_{IN}+$ equals $V_{IN}-$, bias circuit 8 causes the bias current I to be divided in half so that I/2 flows through transistors 10 and 12, and I/2 flows through transistors 11 and 13. A quiescent current of NI/2 then is forced by bias circuit 8 to flow through transistors 1 and 6 and load device 4. A quiescent current NI/2 also is forced to flow through transistors 2 and 7 and load device 5.

Figure 1:
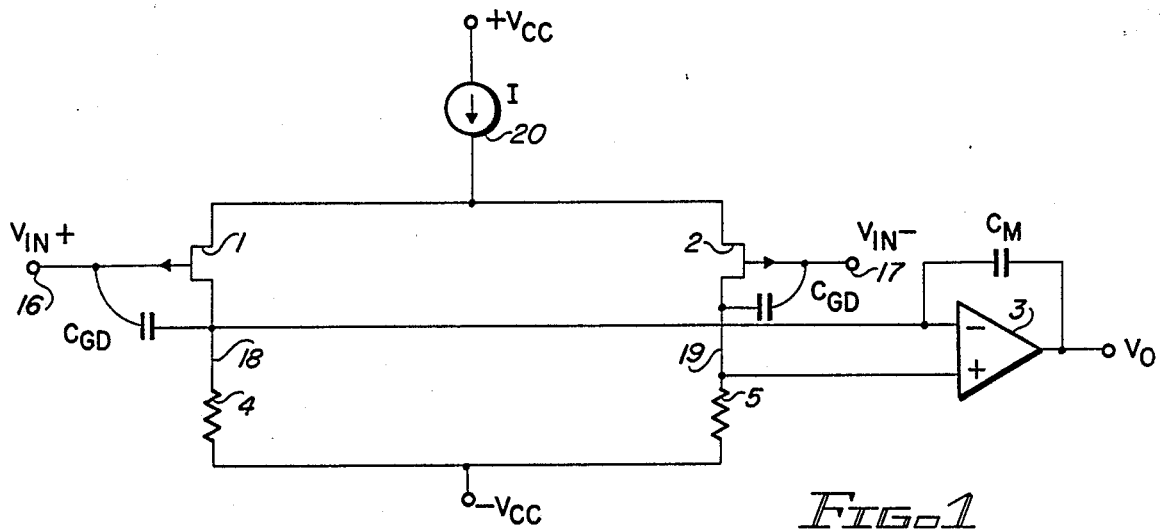
FIG. 1 is a schematic circuit diagram of a prior art amplifier that produces low noise operation, but at the expense of low speed operation.

The noise level produced by the circuit of FIG. 3 is low, comparable to that of the circuit of FIG. 1. The bias circuit 8 does not feed any current noise into the differential signal path from the input terminals 16 and 17 through the emitters of transistors 6 and 7, to the nodes 31 and 32. Voltage noise in the bias circuit transistors 10, 11, 12, and 13 and current source 9 is "common mode" to both of input terminals 16 and 17, and has no differential effect. As those skilled in the art know, JFETs such as 1 and 2 inherently have much higher noise than bipolar transistors 6 and . Since the noise of JFETs 1 and 2 is much greater than that of the bipolar transistors 6 and 7, the RMS (root mean square) summation of the noise components is approximately equal to the noise of JFETs 1 and 2.

The source follower JFETs 1 and 2 drive the emitters of common-base-connected transistors 6 and 7, respectively. The effects of the Gm's of JFETs 1 and 2 on both gain and noise dominate the effects of the Gm's of the bipolar transistors 6 and 7 on gain and noise, because the Gm of JFETs 1 and 2 is, for example, approximately 3.3 milliamps per volt and the Gm of transistors 6 and 7 is, for example, only approximately 40 milliamps per volt. The low base-collector capacitances of transistors 6 and 7 do not limit bandwidth nearly as much as the gate-drain capacitances of the input JFETs of the circuit of FIG. 1. Therefore, the circuit of FIG. 3 has much higher frequency response.

The JFET input transistors 1 and 2 provide the needed high input impedance for many operational amplifier designs. The high speed circuit of FIG. 2 requires the use of noise-adding emitter degeneration resistors 6A and 7A. The circuit of FIG. 3 does not require such emitter degeneration resistors, since the Gm of the JFETs 1 and 2 dominates, allowing a small compensation capacitor $C_M$ to achieve an acceptable slew rate for a high speed operational amplifier.

Figure 2:
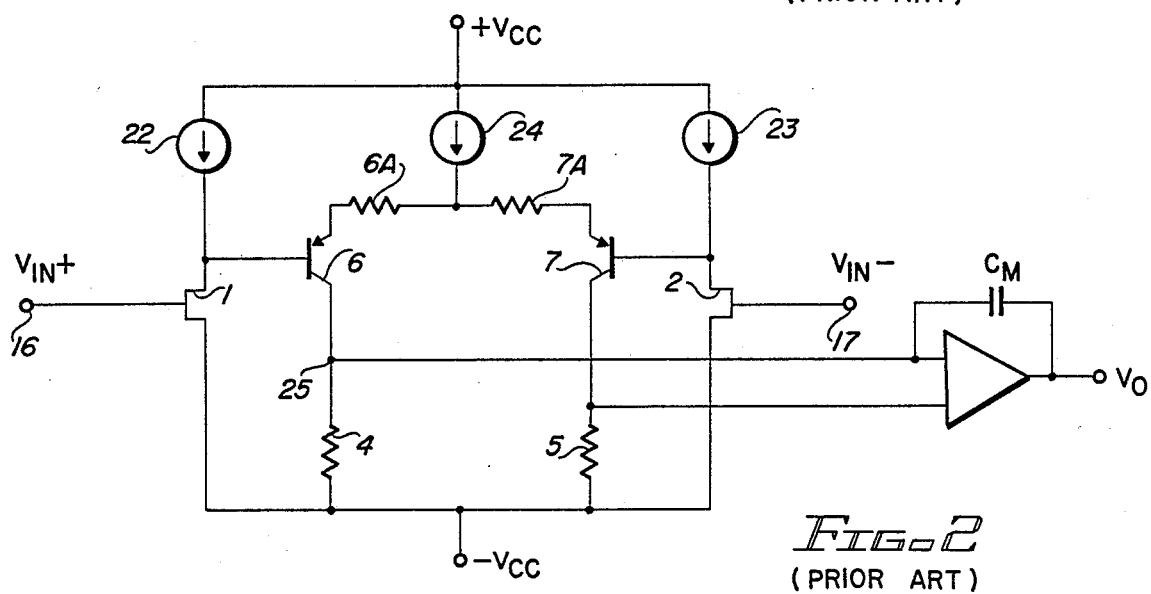
FIG. 2 is a schematic diagram of a prior art circuit that produces high speed operation, but at the expense of high noise levels in the differential signal path of the circuit.

The circuit of FIG. 3 has been found to have bandwidth, slew rate, and settling time approximately equal to those of the circuit of FIG. 2, and to have noise approximately as low as the circuit of FIG. 1. The circuit of FIG. 3, using the above indicated sizes for transistors 6, 7, 10, and 11 and JFETs 1, 2, 12, and 13 has a broad band noise level of only approximately 5 nanovolts/SQRT(hertz). (SQRT means "square root of".) A relatively small value of compensation capacitor, of approximately 20 picofarods, is needed to provide a bandwidth of approximately 18 megahertz for the circuit of FIG. 3.

Figure 4:
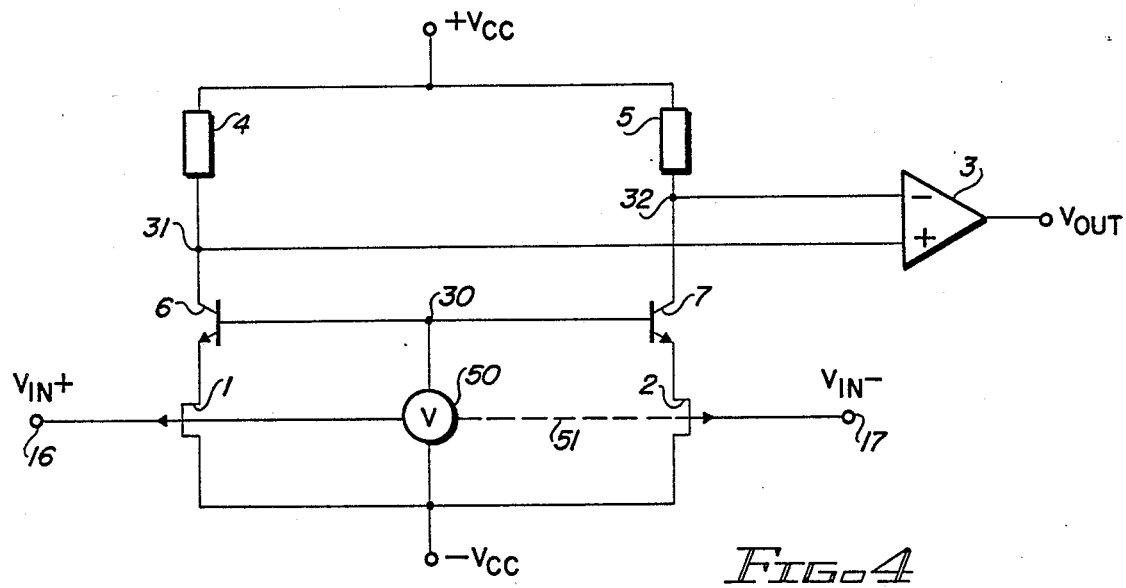
FIG. 4 is a schematic diagram of another embodiment of the invention.

FIG. 4 shows another embodiment of the invention, in which the bias circuit connected to the bases of transistors 6 and 7 is a controlled voltage source circuit 50 connected between conductors 30 and $-V_{CC}$ or a ground conductor (not shown). $V_{IN}{}^{30}$ is connected to one input of voltage source 50 and $V_{IN}{}^-$ is connected to another input thereof. Dotted line 51 indicates that it is only essential that voltage source 50 be responsive to one of the input voltages $V_{IN}{}^+$ and $V_{IN}{}^-$. The voltage applied to conductor 30 is responsive to the input common mode voltage. Or, if only one input voltage is connected to voltage source 50, the voltage on conductor 30 is responsive to that input voltage.

In FIG. 5, an amplifier similar to that of FIG. 3 is shown, with a voltage source circuit 60 including two NPN transistors 60A and 60B having their bases connected together. The collector of transistor 60A is connected to the emitter of an NPN transistor 67 having its base connected to common-base conductor 30 and its collector connected to $+V_{CC}$. The base and collector of transistor 60B are connected together and to one terminal of a resistor 60C, the other terminal of which is connected to the collector of transistor 60A. The emitter of transistor 60B is connected by resistor 60D to the collector of a constant current source NPN transistor 62 and to the emitter of transistor 60A. The collector of transistor 62 is connected to the base of PNP transistor 61, the emitter of which is connected to the drains of JFETs 1, 12, 13, and 2. The base of transistor 62 is driven by a bias voltage $V_{B4}$. The emitter of transistor 62 is connected by a resistor to $-V_{CC}$. The collector of transistor 61 is connected to $-V_{CC}$. The voltage source circuit 60 maintains the drains of transistors 1, 12, 13, and 2 at approximately one volt below the source voltages thereof.

In FIG. 5, current source 9 includes a PNP current mirror with two PNP transistors having suitable bias voltages $V_{B2}$ and $V_{B3}$ applied to their respective bases. Load devices 4 and 5 are implemented using PNP current mirrors.

Use of the voltage source circuit 60 results in improved common mode rejection ratio, since the source-drain voltage of the JFETs 1 and 2 no longer vary with input common mode voltage swings. Therefore, miss-matches in their output resistances have no appreciable effect. The emitter degeneration resistors 6A and 7A can be as trimmable resistors having a small value, such as 10 ohms, to allow precise adjustment of offset voltage without introducing appreciable noise into the circuit, resistors 10A and 11A can be scaled up in value to resistors 6A and 7A by the ratio N.

While the invention has been described with reference to several embodiments thereof, those skilled in the art will be able to make various modifications to the described embodiments without departing from the true spirit and scope of the invention. For example, if the sources of JFETs 12 and 13 are connected together, and one of diode-connected transistors 10 and 11 is omitted, circuit operation remains substantially unchanged. Alternatively, if the sources of JFETs 12 and 13 are connected together, the diode could be omitted, and the sources of JFETs 12 and 13 could be coupled to conductor 30 by means of a resistor having a value such that the voltage across it is approximately equal to the $V_{BE}$ voltage of transistors 6 and 7. High speed, low noise operation also may be achieved if both transistor 10 and JFET 12 are omitted or if both transistor 11 and JFET 13 are omitted. In FIG. 5, the voltage source circuit 60 could be coupled to a conductor other than the emitter of transistor 67, for example to the emitter of transistor 10 or transistor 11, and still accomplish the function of limiting the drain-to-source voltages of JFETs 1, 2, 12, and 13

What is claimed is:

1. A high speed, low noise differential amplifier comprising in combination:
  (a) a first field effect transistor having a gate coupled to a first input terminal, a source, and a drain coupled to a first supply voltage conductor, and a second field effect transistor having a gate coupled to a second input terminal, a source, and a drain coupled to the first supply voltage conductor;
  (b) a first transistor having an emitter coupled to the source of the first field effect transistor, a base, and a collector coupled to a first output terminal, and a second transistor having an emitter coupled to the source of the second field effect transistor, a base coupled to the base of the first transistor, and a collector coupled to a second output terminal;
  (c) a first load device having a first terminal coupled to a second supply voltage conductor and a second terminal coupled to the collector of the first transistor, and a second load device having a first terminal coupled to the second supply voltage conductor and a second terminal coupled to the collector of the second transistor;
  (d) a bias circuit including a current source, a third transistor and a fourth transistor each having a base and collector connected to the bases of the first and second transistors and to the current source, a third field effect transistor having a source coupled to the emitter of the third transistor, a gate coupled to the first input terminal and a drain coupled to the first supply voltage conductor, and a fourth field effect transistor having a source coupled to the emitter of the fourth transistor, a gate coupled to the second input terminal and a drain coupled to the first supply voltage conductor.

2. The high speed, low noise differential amplifier of claim 1 wherein the first, second, third, and fourth transistors are NPN transistors and the first, second, third, and fourth field effect transistors are P channel transistors.

3. The high speed, low noise differential amplifier of claim 2 wherein the first, second, third, and fourth field effect transistors are junction field effect transistors.

4. The high speed, low noise differential amplifier of claim 1 wherein the channel width to channel length ratios of the first and second field effect transistors are equal and are scaled by a ratio to the channel width to channel length ratios of the third and fourth field effect transistors, and wherein the emitter areas of the first and second transistors are equal and are scaled by ratio of the emitter area of the third and fourth transistors.

5. The high speed, low noise differential amplifier of claim 1 including a second stage amplifier having an inverting input coupled to one of the first and second output terminals and a non-inverting input coupled to the other of the first and second output terminals.

6. The high speed, low noise differential amplifier of claim 1 wherein the current source is a constant current source.

7. The high speed, low noise differential amplifier of claim 1 wherein the channel width to length ratio of the first and second field effect transistors has a value which results in noise voltage produced in the first and second field effect transistors being below a preselected level.

8. A high speed, low noise differential amplifier comprising in combination:
(a) a first field effect transistor having a gate coupled to a first input terminal, a source, and a drain coupled to a first supply voltage conductor, and a second field effect transistor having a gate coupled to a second input terminal, a source, and a drain coupled to the first supply voltage conductor;
(b) a first transistor having an emitter coupled to the source of the first field effect transistor, a base, and a collector coupled to a first output terminal, and a second transistor having an emitter coupled to the source of the second field effect transistor, a base connected to the base of the first transistor, and a collector coupled to a second output terminal;
(c) a first load device having a first terminal coupled to a second supply voltage conductor and a second terminal coupled to the collector of the first transistor, and a second load device having a first terminal coupled to the second supply voltage conductor and a second terminal coupled to the collector of the second transistor;
(d) a bias circuit including
 i. a constant current source,
 ii. means responsive to a first input voltage applied to the first input terminal and a second input voltage applied to the second input terminal for splitting a current delivered by the constant current source into first and second currents in response to the input voltage, and
 iii. means responsive to the first and second currents for establishing a bias voltage on the bases of the first and second transistors.
 iv. means responsive to the bias voltage and the first input voltage for forcing a third current to flow through the first transistor, the first field effect transistor, and the first load device,
 v. means responsive to the bias voltage and the second input voltage for forcing a fourth current to flow through the second transistor, the second field effect transistor, and the second load device.

9. The high speed, low noise differential amplifier of claim 8 wherein the sum of the first and second currents is constant.

10. A high speed, low noise differential amplifier comprising in combination:
(a) a first field effect transistor having a gate coupled to a first input terminal, a source, and a drain coupled to a first supply voltage conductor, and a second field effect transistor having a gate coupled to a second input terminal, a source, and a drain coupled to the first supply voltage conductor;
(b) a first transistor having an emitter coupled to the source of the first field effect transistor, a base, and a collector coupled to a first output terminal, and a second transistor having an emitter coupled to the source of the second field effect transistor, a base connected to the base of the first transistor, and a collector coupled to a second output terminal;
(c) a first load device having a first terminal coupled to a second supply voltage conductor and a second terminal coupled to the collector of the first transistor, and a second load device having a first terminal coupled to the second supply voltage conductor and a second terminal coupled to the collector of the second transistor;
(d) bias circuit means connected to the bases of the first and second transistors, one of the first and second supply voltage conductors, and responsive to an input signal on one of the first and second input terminals for producing a common bias voltage on the bases of the first and second transistors, thereby causing a first current to flow through the first transistor, the first load device, and the first field effect transistor, and a second current to flow through the second transistor, the second load device, and the second field effect transistor to produce a differential output signal between the collectors of the first and second transistors, the differential output signal being substantially free of any noise produced on the bases of the first and second transistors by the bias circuit means.

11. The high speed, low noise differential amplifier of claim 10 wherein the Gm of the first and second field effect transistors is sufficiently high that noise signals produced in the first and second field effect transistors are below a certain level.

12. The high speed, low noise differential amplifier of claim 10 wherein the bias circuit means includes a voltage source circuit coupled between the sources and drains of the first and second field effect transistors to set the drain-to-source voltages of the first and second field effect transistors to a certain voltage.

13. The high speed, low noise differential amplifier of claim 10 including means for setting the drain-to-source voltages of the first and second field effect transistors to a certain voltage.

14. A method of achieving high speed, low noise amplification of a differential input signal, comprising the steps of:
   (a) applying a first input voltage to a gate electrode of a first field effect transistor and applying a second input voltage to a gate electrode of a second field effect transistor, and also applying the first and second input voltages to a bias circuit;
   (b) causing first and second currents to flow in the bias circuit in response to the first and second input voltages, the relative values of the first and second currents being dependent on the first and second input voltages and producing a bias voltage in response to the first and second currents;
   (c) forcing a third current to flow through a first bipolar transistor and a first load device in response to the first input voltage and the bias voltage, and forcing a fourth current to flow through a second bipolar transistor and a second load device in response to the second input voltage and the bias voltage, to thereby produce an output voltage between a terminal of the first load device and a terminal of the second load device.

15. The method of claim 14 including causing the sum of the first and second currents to be constant.

16. The method of claim 14 including causing the Gm of the first and second field effect transistors to be sufficiently high that noise voltage produced in the first and second field effect transistors is below a preselected level.

17. A high speed, low noise differential amplifier comprising in combination:
   (a) a first field effect transistor having a gate coupled to a first input terminal, a source, and a drain coupled to a first supply voltage conductor, and a second field effect transistor having a gate coupled to a second input terminal, a source, and a drain coupled to the first supply voltage conductor;
   (b) a first transistor having an emitter coupled to the source of the first field effect transistor, a base, and a collector coupled to a first output terminal, and a second transistor having an emitter coupled to the source of the second field effect transistor, a base connected to the base of the first transistor, and a collector coupled to a second output terminal;
   (c) a first load device having a first terminal coupled to a second supply voltage conductor and a second terminal coupled to the collector of the first transistor, and a second load device having a first terminal coupled to the second supply voltage conductor and a second terminal coupled to the collector of the second transistor;
   (d) bias circuit means connected to at least one of the first and second input terminals and to the bases of the first and second transistors for producing a bias voltage on the bases of the first and second transistors to cause a first current to flow through the first transistor, the first load device, and the first field effect transistor, and a second current to flow through the second transistor, the second load device, and the second field effect transistor, whereby a differential output signal produced between the collectors of the first and second transistors in response to a differential input voltage applied between the first and second input terminals is substantially free of any noise produced on the bases of the first and second transistors by the bias circuit means.

* * * * *